United States Patent
Chen et al.

(10) Patent No.: US 11,743,988 B2
(45) Date of Patent: Aug. 29, 2023

(54) POWER ADJUSTING CIRCUIT, LED POWER SUPPLY AND LED LUMINAIRE

(71) Applicant: SHANGHAI LUMIXESS LIGHTING TECHNOLOGY COMPANY, Shanghai (CN)

(72) Inventors: Zhong Chen, Shanghai (CN); Xin Wu, Shanghai (CN)

(73) Assignee: SHANGHAI LUMIXESS LIGHTING TECHNOLOGY COMPANY, Shanghai (CN)

( * ) Notice: Subject to any disclaimer, the term of this patent is extended or adjusted under 35 U.S.C. 154(b) by 14 days.

(21) Appl. No.: 17/329,442

(22) Filed: May 25, 2021

(65) Prior Publication Data
US 2022/0151041 A1    May 12, 2022

(30) Foreign Application Priority Data

Nov. 11, 2020 (CN) .......................... 202011255592.3
Apr. 6, 2021 (CN) .......................... 202110367235.4

(51) Int. Cl.
| | | |
|---|---|---|
| H05B 45/30 | (2020.01) | |
| H05B 45/305 | (2020.01) | |
| G01R 19/175 | (2006.01) | |
| H05B 45/335 | (2020.01) | |
| H05B 45/325 | (2020.01) | |
| H05B 45/39 | (2020.01) | |

(52) U.S. Cl.
CPC ......... *H05B 45/305* (2020.01); *G01R 19/175* (2013.01); *H05B 45/325* (2020.01); *H05B 45/335* (2020.01); *H05B 45/39* (2020.01)

(58) Field of Classification Search
CPC ...... H05B 45/37; H05B 45/39; H05B 45/305; H05B 45/325; H05B 45/335
See application file for complete search history.

(56) References Cited

U.S. PATENT DOCUMENTS

| | | | |
|---|---|---|---|
| 8,106,597 B2 * | 1/2012 | Mednik | H05B 45/38 315/185 S |
| 9,894,718 B1 * | 2/2018 | Xiong | H05B 45/39 |
| 2012/0217884 A1 * | 8/2012 | Raykhman | H05B 45/325 315/188 |

(Continued)

*Primary Examiner* — Tung X Le
(74) *Attorney, Agent, or Firm* — Ohlandt, Greeley and Perle, LLP (57) ABSTRACT

A power adjusting circuit, an LED power supply and an LED luminaire. The power adjusting circuit includes: a zero-crossing detecting unit, adapted to generate a zero-crossing detection signal according to an high-frequency signal, wherein the zero-crossing detection signal is a pulse wave or a square wave, and the high-frequency signal is a sine wave or an AC wave; a signal processing unit, adapted to determine a second number of pulses or square waves of the zero-crossing detection signal corresponding to an adjustment signal that is input externally, according to a first number of pulses or square waves of the zero-crossing detection signal corresponding to a full-load operation of a functional device; a counting unit, adapted to generate a switch control signal according to the first number and the second number; and a switch unit, adapted to control an output of the high-frequency signal according to the switch control signal.

17 Claims, 6 Drawing Sheets

(56) References Cited

U.S. PATENT DOCUMENTS

| 2015/0084527 | A1* | 3/2015 | Siu | ........................ | H05B 45/395 |
| | | | | | 315/186 |
| 2017/0311400 | A1* | 10/2017 | Newman, Jr. | ......... | H05B 45/382 |
| 2021/0068229 | A1* | 3/2021 | Yu | ........................ | H05B 45/345 |

* cited by examiner

Figure 7

POWER ADJUSTING CIRCUIT, LED POWER SUPPLY AND LED LUMINAIRE

CROSS-REFERENCE TO RELATED APPLICATIONS

This application claims the benefit of priorities to Chinese Patent Application No. 202011255592.3, filed on Nov. 11, 2020, and entitled "A POWER ADJUSTING CIRCUIT and AN LED LUMINAIRE", and to Chinese Patent Application No. 202110367235.4, filed on Apr. 6, 2021, and entitled "POWER ADJUSTING CIRCUIT, LED POWER SUPPLY AND LED LUMINAIRE", the entire disclosure of which are incorporated herein by reference.

TECHNICAL FIELD

The present disclosure generally relates to LED (light emitting diode) lighting technology field, and more particularly, to a power adjusting circuit, an LED power supply and an LED luminaire.

BACKGROUND

LED has advantages of long life, high luminous efficiency, no radiation, impact resistance and low power consumption. It is an energy-saving and environmental friendly lighting source. However, LED is also a sensitive semiconductor device which needs to work under a constant current. The main function of an LED driving circuit is to convert a changing alternating current (AC) into a constant current for the LED, so as to ensure that the LED can work safely and stably under various conditions. In many occasions, LED power supplies are also required to provide dimming function. Specifically, the output current of the LED power supplies needs to be adjusted according to application requirements, so as to change luminous flux of an LED luminescent component.

There are two basic types of LED power supplies: linear power supplies and switching power supplies. A MOS transistor in a linear power supply work in the linear region, and a resistance Rdson of the MOS transistor can be adjusted through a feedback control, so as to keep outputting a constant current. A switching power supply usually uses Pulse Width Modulation (PWM) or Pulse Frequency Modulation (PFM) technology, where a MOS transistor works in a high-frequency switching mode and a controller dynamically controls the MOS transistor to switch on or off according to a feedback value, so as to keep outputting a constant current. Compared with the switching power supply, the linear power supply has a simpler circuit structure, which requires fewer peripheral components and does not generate electromagnetic interference (EMI) issue due to high-frequency switching. However, power conversion efficiency of the linear power supply is much lower than that of the switching power supply. In addition, in order to dissipate heat caused by power consumption, a bulky heatsink needs to be installed on a power transistor in the linear power supply, which increases device volume and cost, and therefore limits product miniaturization design, resulting in difficulty in high-power lighting applications. In comparison, the power conversion efficiency of the switching power supply is much higher than that of the linear power supply, which can be as high as about 90%. Besides, as the switching frequency increases, the device volume can be further reduced and power density of the power supply can be improved. However, the switching power supply which works in the high-frequency switching mode will generate serious electromagnetic interference, which may affect normal operations of peripheral electronic and electrical products.

SUMMARY

Embodiments of the present disclosure provide a power adjusting circuit, an LED power supply and an LED luminaire, so as to reduce electromagnetic interference in the LED power supply and the LED luminaire.

In an embodiment of the present disclosure, a power adjusting circuit is provided, including: a zero-crossing detecting unit, adapted to generate a zero-crossing detection signal according to an high-frequency signal input externally, wherein the zero-crossing detection signal is a pulse wave or a square wave, and the high-frequency signal is a sine wave or an alternating current (AC) wave; a signal processing unit, adapted to determine a second number of pulses or square waves of the zero-crossing detection signal corresponding to an adjustment signal that is input externally, according to a first number of pulses or square waves of the zero-crossing detection signal corresponding to a full-load operation of a functional device, wherein the first number is preset; a counting unit, adapted to generate a switch control signal according to the first number and the second number; and a switch unit, adapted to control an output of the high-frequency signal according to the switch control signal.

Optionally, the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

Optionally, the signal processing unit includes: an input interface, adapted to receive the adjustment signal, wherein the adjustment signal includes a dimming signal; a dimming signal processor, adapted to determine the second number of the zero-crossing detection signal corresponding to the dimming signal, according to the first number of the zero-crossing detection signal corresponding to the full-load operation of the functional device; and an output interface, adapted to output the first number and the second number.

Optionally, the first number is changeable.

Optionally, the counting unit includes: a storage unit, adapted to store the to first number and the second number received from the signal processing unit; a pulse counting unit, adapted to count a number of rising or falling edges of pulses or square waves of the zero-crossing detection signal output by the zero-crossing detecting unit and generate a counting result, and when the counting result is equal to the first number, the pulse counting unit is adapted to output a set instruction; and a comparison unit, adapted to compare the counting result with the second number, and when the counting result is equal to the second number, the comparison unit is adapted to output a reset instruction.

Optionally, the counting unit further includes a trigger unit, where one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

Optionally, the switch unit includes a power switch transistor.

Optionally, the power switch transistor includes a Metal-Oxide-Semiconductor (MOS) transistor, or a Bipolar Transistor, or an Insulated Gate Bipolar Transistor (IGBT), or a thyristor.

In an embodiment of the present disclosure, an LED power supply is provided, including: a frequency conversion circuit, adapted to convert an external power line frequency signal into a high-frequency signal; and a power adjusting circuit, adapted to modulate the high frequency signal into a periodic sinusoidal counting signal according to an external input dimming signal.

Optionally, the LED power supply further includes: a rectifier filter circuit, adapted to, according to the periodic sinusoidal counting signal, generate a driving direct current which is used as a working current of an LED luminescent component.

Optionally, the power adjusting circuit includes: a zero-crossing detecting unit, adapted to generate a zero-crossing detection signal according to the high-frequency signal, wherein the zero-crossing detection signal is a pulse wave or a square wave, and the high-frequency signal is a sine wave or an alternating current (AC) wave; a signal processing unit, adapted to determine a second number of pulses or square waves of the zero-crossing detection signal corresponding to the dimming signal, according to a first number of pulses or square waves of the zero-crossing detection signal corresponding to a full-load operation of the LED luminescent component, wherein the first number is preset; a counting unit, adapted to generate a switch control signal according to the first number and the second number; and a switch unit, adapted to control an output of the high-frequency signal according to the switch control signal.

Optionally, the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

Optionally, the signal processing unit includes: an input interface, adapted to receive the external input dimming signal; a dimming signal processor, adapted to determine the second number of the zero-crossing detection signal corresponding to the dimming signal, according to the first number of the zero-crossing detection signal corresponding to the full-load operation of the LED luminescent component; and an output interface, adapted to output the first number and the second number.

Optionally, the first number is changeable.

Optionally, the counting unit includes: a storage unit, adapted to store the first number and the second number received from the signal processing unit; a pulse counting unit, adapted to count a number of rising or falling edges of pulses or square waves of the zero-crossing detection signal output by the zero-crossing detecting unit and generate a counting result, and when the counting result is equal to the first number, the pulse counting unit is adapted to output an set instruction; a comparison unit, adapted to compare the counting result with the second number, and when the counting result is equal to the second number, the comparison unit is adapted to output a reset instruction; and a trigger unit, where one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

In an embodiment of the present disclosure, an LED luminaire including an LED luminescent component is provided, where the LED luminaire further includes: a frequency conversion circuit, adapted to convert an external power line frequency signal into a high-frequency signal; a power adjusting circuit, adapted to modulate the high frequency signal into a periodic sinusoidal counting signal according to an external input dimming signal; and a rectifier filter circuit, adapted to, according to the periodic sinusoidal counting signal, generate a driving direct current for the LED luminescent component.

Optionally, the power adjusting circuit includes: a zero-crossing detecting unit, adapted to generate a zero-crossing detection signal according to the high-frequency signal, wherein the zero-crossing detection signal is a pulse wave or a square wave, and the high-frequency signal is a sine wave or an alternating current (AC) wave; a signal processing unit, adapted to determine a second number of pulses or square waves of the zero-crossing detection signal corresponding to the dimming signal, according to a first number of pulses or square waves of the zero-crossing detection signal corresponding to a full-load operation of the LED luminescent component, wherein the first number is preset; a counting unit, adapted to generate a switch control signal according to the first number and the second number; and a switch unit, adapted to control an output of the high-frequency signal according to the switch control signal.

Optionally, the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

Optionally, the signal processing unit includes: an input interface, adapted to receive the external input dimming signal; a dimming signal processor, adapted to determine the second number of the zero-crossing detection signal corresponding to the dimming signal, according to the first number of the zero-crossing detection signal corresponding to the full-load operation of the LED luminescent component; and an output interface, adapted to output the first number and the second number.

Optionally, the counting unit includes: a storage unit, adapted to store the first number and the second number received from the signal processing unit; a pulse counting unit, adapted to count a number of rising or falling edges of pulses or square waves of the zero-crossing detection signal outputted by the zero-crossing detecting unit and generate a counting result, and when the counting result is equal to the first number, the pulse counting unit is adapted to output an set instruction; a comparison unit, adapted to compare the counting result with the second number, and when the counting result is equal to the second number, the comparison unit is adapted to output a reset instruction; and a trigger unit, wherein one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

According to the embodiments of the present disclosure, the power adjusting circuit applies half-waves of an AC sine or quasi-sine wave as an energy base unit, and by controlling the number of energy base units output to a subsequent functional device per period, the power of the functional device can be adjusted.

Furthermore, the LED power supply and the LED luminaire provided in the embodiments of the present disclosure detect and count the number of the AC sine or quasi-sine wave transforming from a positive half cycle to a negative half cycle or from a negative half cycle to a positive half cycle, thereby controlling the number of sine or quasi-sine half-waves provided to the LED luminescent component per period. In this way, the power provided to the LED luminescent component can be controlled, thereby controlling the brightness of the LED luminescent component.

Furthermore, in the power adjusting circuit, the LED power supply and the LED luminaire provided in the embodiments of the present disclosure, the switch unit performs chopper control on an AC sine or quasi-sine wave rather than a DC voltage/current, and switching operations only occur when the AC sine or quasi-sine wave transforms through zero-crossing points, which greatly reduces electromagnetic interference in the LED power supply and the LED luminaire.

DETAILED DESCRIPTION

In prior art, an LED dimming power supply usually uses a front end rectifier circuit to convert an AC to a direct current (DC). The DC is converted into a high frequency pulse wave through different power conversion circuits in which power switch transistors are controlled to switch at high frequencies according to a certain control strategy (for example, PWM or PFM). Then the high frequency pulse wave is rectified and filtered by a back end rectifier circuit into a DC to supply an LED luminescent component. And an external dimming signal is applied to a closed-loop control circuit of the LED dimming power supply, which changes the duty cycle of pulses (PWM) or the frequency of pulses (PFM), so that a load current can be adjusted to change brightness of the LED luminescent component.

As described above, no matter which control strategy (for example, PWM or PFM) is used, transistors in circuits of the LED power supply switches at high frequencies, electromagnetic interference is mainly generated at a switching frequency and multipliers thereof, and peaks of the electromagnetic interference are also mainly generated at the switching frequency and multipliers thereof, which illustrate that periodic PWM/PFM pulses are the main cause of the electromagnetic interference in the existing switching circuits of the LED power supply.

Embodiments of the present disclosure provide a power adjustment circuit, an LED power supply and an LED luminaire, in which periodic PWM/PFM pulses and high-frequency switching are not needed, thereby reducing electromagnetic interference.

Figure 1:
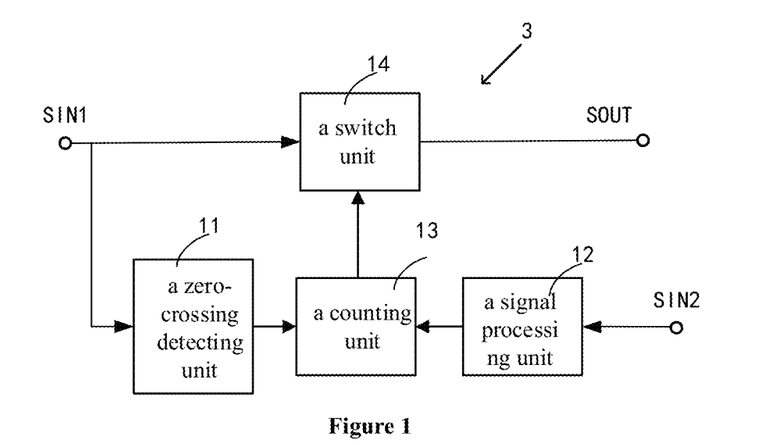
FIG. 1 schematically illustrates a structural diagram of a power adjusting circuit according to an embodiment.

Referring to FIG. 1, FIG. 1 schematically illustrates a structural diagram of a power adjusting circuit according to an embodiment. The power adjusting circuit is adapted to adjust power of a functional device during operation. As shown in FIG. 1, a power adjusting circuit 3 includes: a zero-crossing detecting unit 11, adapted to generate a zero-crossing detection signal SP according to a high-frequency signal SIN input externally, wherein the zero-crossing detection signal SP is a pulse wave or a square wave, and the high-frequency signal SIN is a sine wave or an AC wave; a signal processing unit 12, adapted to determine a second number of pulses or square waves of the zero-crossing detection signal SP corresponding to an adjustment signal ST that is input externally, according to a first number of pulses or square waves of the zero-crossing detection signal SP corresponding to a full-load operation of a functional device, wherein the first number is preset; a counting unit 13, adapted to generate a switch control signal according to the first number and the second number; and a switch unit 14, adapted to control an output of the high-frequency signal according to the switch control signal.

Those skilled in the art can understand that the high-frequency signal is a sine wave or an AC wave which periodically reverses direction and changes its magnitude continuously with time, in contrast to a DC which flows only in one direction. In addition, since a cosine wave can be obtained by shifting a sine wave, a high-frequency signal which is a cosine wave is also within the protection scope of the present disclosure.

Figure 2:
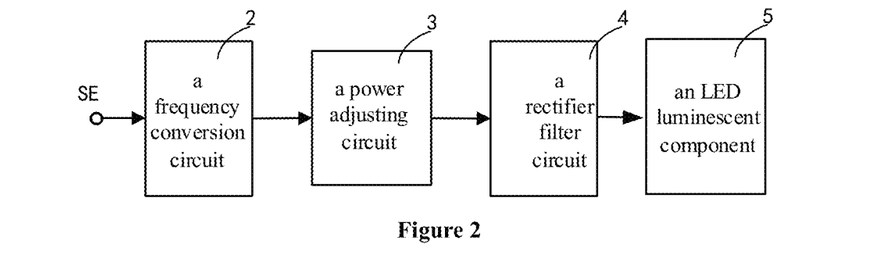
FIG. 2 schematically illustrates a structural diagram of an LED luminaire according to an embodiment.

A power adjusting circuit applied to drive a luminescent component is taken as an example hereafter. Referring to FIG. 2, FIG. 2 schematically illustrates a structural diagram of an LED luminaire according to an embodiment. As shown in FIG. 2, an LED luminaire 1 includes a luminescent component 5. The LED luminaire 1 further includes: a frequency conversion circuit 2, adapted to convert an external power line frequency signal SE into a high-frequency signal; a power adjusting circuit 3, adapted to modulate the high frequency signal output by the frequency conversion circuit 2 into a periodic sinusoidal counting signal according to an external input dimming signal; and a rectifier filter circuit 4, adapted to generate a DC driving current for the LED luminescent component according to the periodic sinusoidal counting signal. Those skilled in the art can understand that the frequency conversion circuit 2 could be indirect frequency conversion circuit or direct frequency conversion circuit, which may be a current direct frequency conversion circuit or a voltage direct frequency conversion circuit; and the rectifier filter circuit 4 includes a full-bridge rectifier circuit or a half-bridge rectifier circuit.

The structure of the power adjusting circuit 3 provided in embodiments of the present disclosure may refer to FIG. 1, which includes: the zero-crossing detecting unit 11, the signal processing unit 12, the counting unit 13 and the switch unit 14. Specifically, the zero-crossing detecting unit 11 is adapted to generate the zero-crossing detection signal SP according to the high-frequency signal SIN, wherein the zero-crossing detection signal SP is relevant to the high-frequency signal SIN transforming from a positive half-cycle to a negative half-cycle or transforming from a negative half-cycle to a positive half-cycle, in other words, the zero-crossing detection signal SP is correlated to inverted points of the high-frequency signal SIN. FIGS. 3A to 3E schematically illustrate circuit structural diagrams of zero-crossing detecting units and voltage waveforms in operation thereof according to embodiments of the present disclosure, where an abscissa in each voltage waveform represents time, and an ordinate in each voltage waveform represents voltage (in other words, signal amplitude).

Figure 3A:
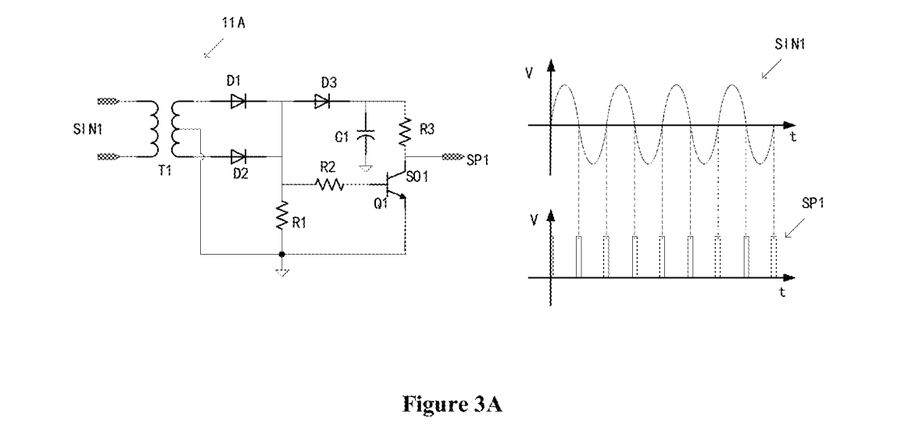
FIGS. 3A to 3E schematically illustrate circuit structural diagrams of zero-crossing detecting units and voltage waveforms in operation thereof according to embodiments of the present disclosure.

Referring to FIG. 3A, a zero-crossing detecting unit 11A includes: a transformer T1, a first diode D1, a second diode D2, a third diode D3, a first resistor R1, a second resistor R2, a third resistor R3, a first capacitor C1 and a first transistor Q1. As shown in FIG. 3A, an input high-frequency signal SIN1 is stepped down by the transformer T1; next, a half-wave rectification is performed on an output of the transformer T1 through the first diode D1 and the second diode D2; next, an output of the first diode D1 and the second diode D2 is divided by the first resistor R1 and the second resistor R2, which forms a base voltage at a base of the first transistor Q1. Specifically, when the base voltage of the first transistor Q1 is less than 0.7V, the first transistor Q1 is turned off, the first capacitor C1 is charged through the third diode D3, and a high level voltage is generated at a collector of the first transistor Q1 through a pull-up resistor and the third resistor R3. However, when the base voltage of the first transistor Q1 is equal to or greater than 0.7V, the first transistor Q1 is turned on, the first capacitor C1 is discharged through the third resistor R3 and the first transistor Q1, and a low level voltage is generated at the collector of the first transistor Q1. The collector of the first transistor Q1 is an output end SO1 of the zero-crossing detecting unit 11A and outputs a zero-crossing detection signal SP1. In the embodiment, the zero-crossing detection signal SP1 is a pulse wave. Referring to the voltage waveform of the zero-crossing detecting unit 11A in operation in FIG. 3A, whenever the to high-frequency signal SIN1 transforms from a positive-half cycle to a negative half-cycle or from a negative half-cycle to a positive half-cycle, that is, whenever the high-frequency signal SIN1 passes through a zero point, the output end SO1 of the zero-crossing detecting unit 11A forms a pulse; in other words, a number of pulses generated by the zero-crossing detecting unit 11A is consistent with a number of half-waves of the high-frequency signal SIN1, and the zero-crossing detection signal SP1 is basically synchronized with the high-frequency signal SIN1. In addition, the third diode D3 in the zero-crossing detecting unit 11A can prevent reverse discharge of the first capacitor C1.

Figure 3B:
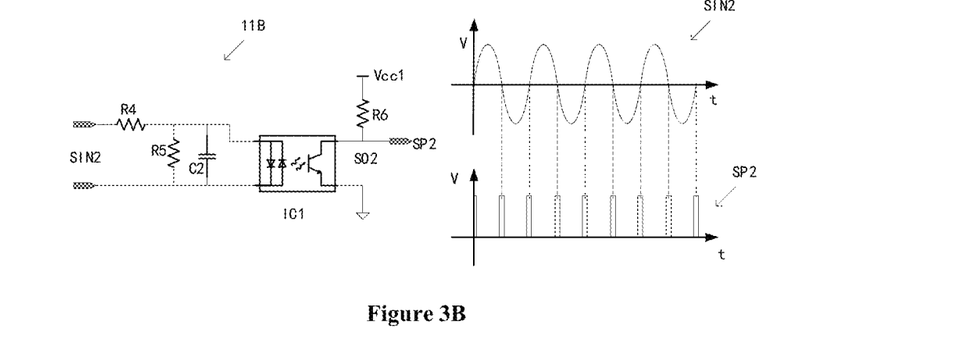

Referring to FIG. 3B, a zero-crossing detecting unit 11B includes: a bidirectional optocoupler IC1, a second capacitor C2, a fourth resistor R4, a fifth resistor R5 and a sixth resistor R6. Since an input signal SIN2 of the zero-crossing detecting unit 11B is a sine wave, most voltage of the input signal SIN2 is applied to the fourth resistor R4 which is a power resistor, and only a small part of the voltage is applied to the bidirectional optocoupler IC1. When the input signal SIN2 transforms through zero points, the bidirectional optocoupler IC1 is turned off, and an output end SO2 of the zero-crossing detecting unit 11B outputs a high level voltage because of an external power supply Vcc1 and the sixth resistor R6; when the voltage of the input signal SIN2 is not close to the zero-crossing points, the bidirectional optocoupler IC1 is turned on, and the output end SO2 of the zero-crossing detecting unit 11B outputs a low level voltage. The signal output by the output end SO2 is a zero-crossing detection signal SP2 which is a pulse wave. Referring to the voltage waveform of the zero-crossing detecting unit 11B in operation in FIG. 3B, whenever the high-frequency signal SIN2 transforms from a positive-half cycle to a negative half-cycle or from a negative half-cycle to a positive half-cycle, that is, whenever the high-frequency signal SIN2 passes through a zero-crossing point, the output end SO2 of the zero-crossing detecting unit 11B outputs a pulse; in other words, a number of pulses generated by the zero-crossing detecting unit 11B is consistent with a number of half-waves of the high-frequency signal SIN2 and the zero-crossing detection signal SP2 is basically synchronized with the high-frequency signal SIN2.

Figure 3C:
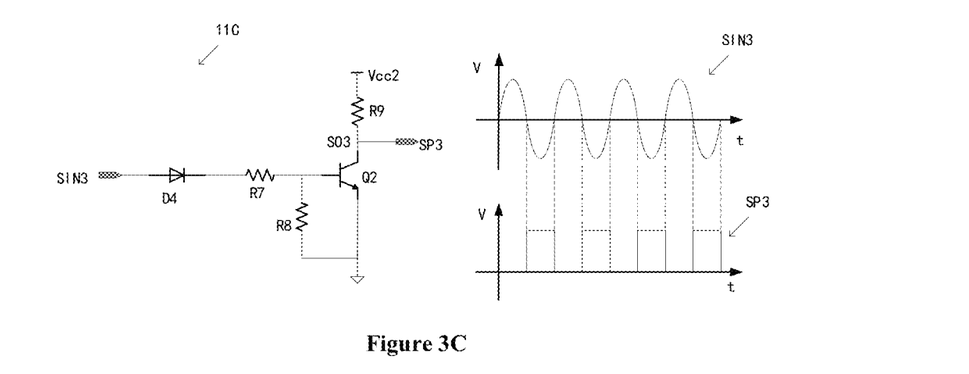

Referring to FIG. 3C, a zero-crossing detecting unit 11C includes: a fourth diode D4, a second transistor Q2, a seventh resistor R7, an eighth resistor R8 and a ninth resistor R9. An input end of the zero-crossing detecting unit 11C inputs a high-frequency signal SIN3, and an output end SO3 outputs a zero-crossing detection signal SP3. As shown in FIG. 3C, when the high-frequency signal SIN3 is equal to or greater than a turn-on voltage of the fourth diode D4, the fourth diode D4 is turned on, the second transistor Q2 is turned on, and a collector of the second transistor Q2 which is the output end SO3 of the zero-crossing detecting unit 11C outputs a logic low level, that is, the zero-crossing detection signal SP3 is a low level voltage; when the input high-frequency signal SIN3 is less than the turn-on voltage of the fourth diode D4, the fourth diode D4 is turned off, the second transistor Q2 is turned off, and the collector of the second transistor Q2 which is the output end SO3 of the zero-crossing detecting unit 11C outputs a logic high level voltage because of the ninth resistor R9 which works as a pull-up resistor, that is, the zero-crossing detection signal SP3 is a high level voltage. Referring to FIG. 3C, in the embodiment, the zero-crossing detection signal SP3 generated at the output end SO3 is a square wave. Referring to the voltage waveform of the zero-crossing detecting unit 11C in operation in FIG. 3C, whenever the high-frequency signal SIN3 transforms from a to positive half-cycle to a negative half-cycle and passes through a zero point, the zero-crossing detection signal SP3 switches from a low level to a high level; or whenever the high-frequency signal SIN3 transforms from a negative half-cycle to a positive half-cycle and passes through a zero point, the zero-crossing detection signal SP3 switches from a high level to a low level. In other words, a number of square waves generated by the zero-crossing detecting unit 11C is consistent with a number of waves of the high-frequency signal SIN3 and the zero-crossing detection signal SP3 is basically synchronized with the high-frequency signal SIN3.

Figure 3D:
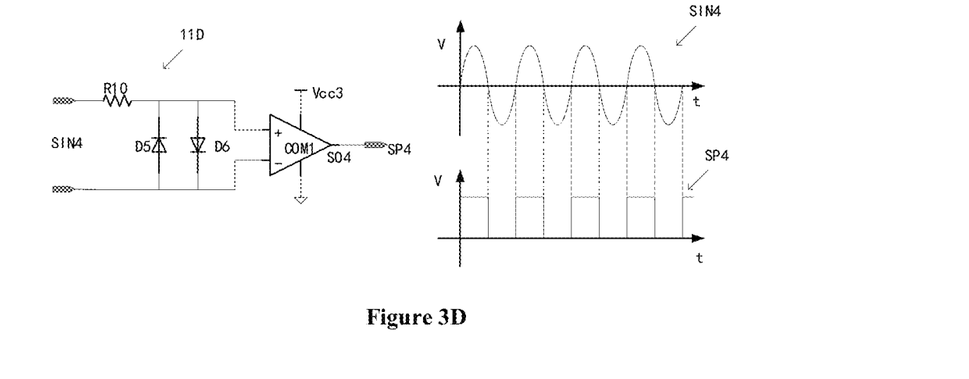

Referring to FIG. 3D, a zero-crossing detecting unit 11D includes: a fifth diode D5, a sixth diode D6, a first comparator COM1 and a tenth resistor R10. An input end of the zero-crossing detecting unit 11D inputs a high-frequency signal SIN4, and an output end SO4 of the zero-crossing detecting unit 11D outputs a zero-crossing detection signal SP4. As shown in FIG. 3D, when an absolute value of a voltage of the high-frequency signal SIN4 is equal to or greater than a diode's turn-on voltage 0.7V, the comparator COM1 remains in a previous mode and does not work; when the absolute value of the voltage of the high-frequency signal SIN4 is less than the diode's turn-on voltage 0.7V, the fifth diode D5 and the sixth diode D6 won't conduct. When a voltage of a positive half-cycle of the high-frequency signal SIN4 decreases to about 0.7V and gradually approaches a zero point, a voltage at a positive input end of the first comparator COM1 is greater than a voltage at a negative input end of the first comparator COM1, the output end SO4 of the first comparator COM1 outputs a high level voltage, that is, the zero-crossing detection signal SP4 is high; when the high-frequency signal SIN4 transforms through a zero point and transforms to a negative half-cycle, the voltage at the positive input end of the first comparator to COM1 is less than the voltage at the negative input end of the first comparator COM1, the output end SO4 of the first comparator COM1 outputs a low level voltage, that is, the zero-crossing detection signal SP4 is low. Referring to FIG. 3D, in the embodiment, the zero-crossing detection signal SP4 generated at the output end SO4 is a square wave. Referring to the voltage waveform of the zero-crossing detecting unit 11D in operation in FIG. 3D, whenever the high-frequency signal SIN4 transforms from a positive half-cycle to a negative half-cycle and passes through a zero point, the zero-crossing detection signal SP4 switches from a high level to a low level; or whenever the high-frequency signal SIN4 transforms from a negative half-cycle to a positive half-cycle and passes through a zero point, the zero-crossing detection signal SP4 switches from a low level to a high level. In other words, a number of square waves generated by the zero-crossing detecting unit 11D is consistent with a number of waves of the high-frequency signal SIN4 and the zero-crossing detection signal SP4 is basically synchronized with the high-frequency signal SIN4.

Figure 3E:
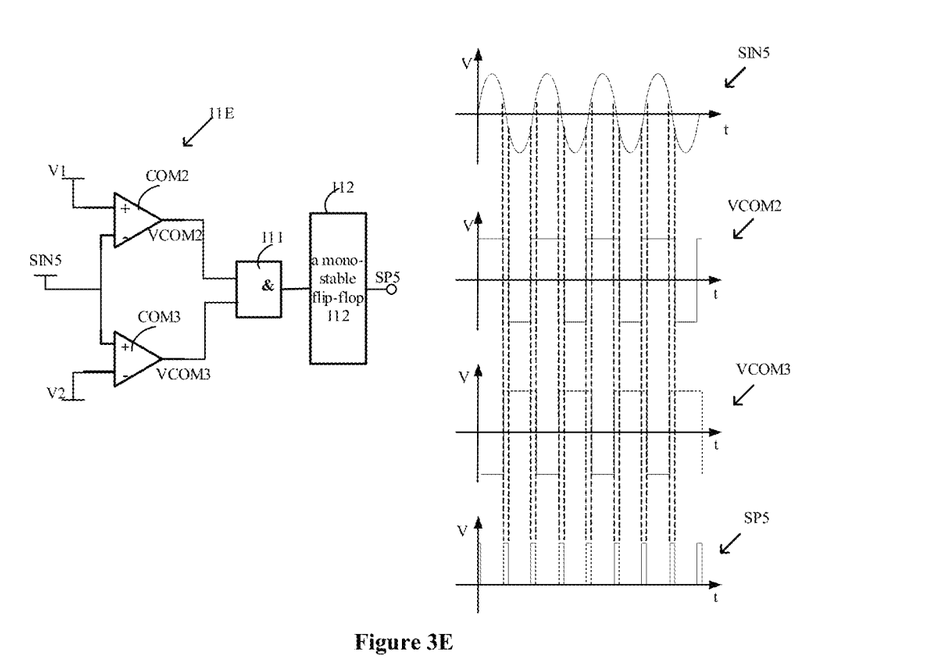

Referring to FIG. 3E, a zero-crossing detecting unit 11E includes: a second comparator COM2 and a third comparator COM3, where a negative input end of the second comparator COM2 and a positive input end of the third comparator COM3 input a high-frequency signal SIN5, and a positive end of the second comparator COM2 inputs a positive reference signal V1, and a negative input end of the third comparator COM3 inputs a negative reference signal V2, wherein an absolute value of the positive reference signal V1 and an absolute value of the negative reference signal V2 are smaller than a maximum value of the high-frequency signal SIN5; a logic AND gate 111, where input ends of the logic AND gate 111 receives an output signal VCOM2 of the second comparator COM2 and an output signal VCOM3 of the third comparator COM3, respectively; and a monostable flip-flop 112 which receives an output signal of the logic AND gate 111 and outputs the zero-crossing detection signal SP5. Referring to FIG. 3E, whenever the input high-frequency signal SIN5 transforms from a positive half-cycle to a negative half-cycle, or from a negative half-cycle to a positive half-cycle, that is, the input high-frequency signal SIN5 transforms through a zero point, a window comparator including the second comparator COM2 and the third comparator COM3 will work. Specifically, when the high-frequency signal SIN5 is less than the positive reference signal V1, the second comparator COM2 outputs a logic low level, that is, the output signal VCOM2 is a low level signal; when the high-frequency signal SIN5 is equal to or greater than the positive reference signal V1, the second comparator COM2 outputs a logic high level, that is, the output signal VCOM2 is a high level signal. Specifically, when the high-frequency signal SIN5 is less than the negative reference signal V2, the third comparator COM3 outputs a logic high level, that is, the output signal VCOM3 is a high level signal; when the high-frequency signal SIN5 is equal to or greater than the negative reference signal V2, the third comparator COM3 outputs a logic low level, that is, the output signal VCOM3 is a low level signal. The output signal VCOM2 of the second comparator COM2 and the output signal VCOM3 of the third comparator COM3 are coupled to the input ends of the logical AND gate 111, and the output end of the logical AND gate 111 is coupled to the monostable flip-flop 112 whose output end outputs the zero-crossing detection signal SP5. As shown in FIG. 3E, a width of the zero-crossing detection signal SP5 is related to the positive reference signal V1 and the negative reference signal V2. Specifically, when a to frequency of the high-frequency signal SIN5 is fixed, the greater the absolute value of the difference between the positive reference signal V1 and the negative reference signal V2, the greater the width of the zero-crossing detection signal SP5; and the smaller the absolute value of the difference between the positive reference signal V1 and the negative reference signal V2, the smaller the width of the zero-crossing detection signal SP5. As shown in FIG. 3E, the zero-crossing detection signal SP5 is basically synchronized with the high-frequency signal SIN5, a number of pulses of the zero-crossing detection signal SP5 is same as a number of half-waves of the high-frequency signal SIN5, and the pulses of the zero-crossing detection signal SP5 are generated at the moments when the high-frequency signal SIN5 transforms through zero points.

Figure 4:
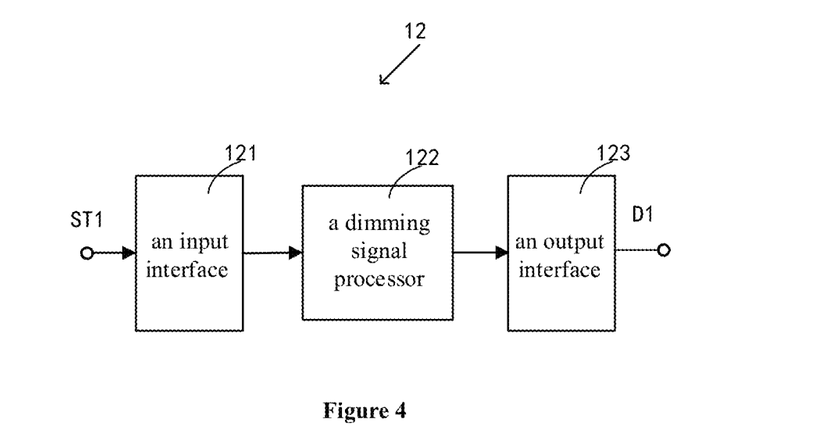
FIG. 4 schematically illustrates a structural diagram of a signal processing unit according to an embodiment.

FIG. 4 schematically illustrates a structural diagram of a signal processing unit 12 of a power adjusting circuit according to an embodiment. Referring to FIG. 4, the signal processing unit 12 includes: an input interface 121, adapted to receive an adjustment signal, wherein the adjustment signal includes a dimming signal ST1; a dimming signal processor 122, adapted to determine a second number M of pulses or square waves of a zero-crossing detection signal SP corresponding to the dimming signal ST1, according to a first number N of pulses or square waves of the zero-crossing detection signal SP corresponding to a full-load operation of an LED luminescent component; and an output interface 123, adapted to output the first number N and the second number M.

In some embodiments, the input interface 121 which is compatible with different dimming protocols and performs signal isolation, digital-to-analog conversion or voltage level conversion, is adapted to receive the dimming signal ST1 from a dimmer, a motion sensor, a photosensitive sensor or a network controller. The dimming signal processor 122 is adapted to proportionally calculate the second number M corresponding to the dimming signal ST1 input externally, according to the first number N of pulses or square waves of the zero-crossing detection signal SP corresponding to the full-load operation of the LED luminescent component. The dimming signal processor 122 calculates the second number M based on a built-in algorithm which supports different dimming protocols, for example, 0-10VDC, DALI and DMX512. Both the first number N and the second number M are a series of binary codes. The first number N corresponds to the number of pulses or square waves of the zero-crossing detection signal SP in a period, that is, corresponds to the number of waves or half-waves of the high-frequency signal SIN in a period; the second number M represents a dimming depth of the dimming signal ST1, which specifically corresponds to the number of pulses or square waves of the zero-crossing detection signal SP corresponding to the dimming signal ST1 in a period, that is, corresponds to the number of waves or half-waves of the high-frequency signal SIN corresponding to the dimming signal ST1 in a period. The greater the second number M, the greater a driving current of the LED luminescent component, and the brighter the LED luminescent component. When the second number M is equal to the first number N, the LED luminescent component has 100% brightness. By taking the 0-10VDC protocol as an example, if the dimming signal ST1 input externally is converted through the input interface 121 and the voltage input to the dimming signal processor 122 is about 1V, the second number M=(1/10) *N=0.1N; if the dimming signal ST1 input externally is converted through the input interface 121 and the voltage input to the dimming signal processor 122 is about 5V, the second number M=(5/10)*N=0.5N; and if the dimming signal ST1 input externally is converted through the input interface 121 and the voltage input to the dimming signal processor 122 is about 10V, the second number M=(10/10)*N=N.

In an embodiment, the first number N may be predetermined according to actual needs.

For example, when the first number N is preset to be 100, the second number (M=1) corresponds to about 1% brightness of the LED luminescent component, and the second number (M=50) corresponds to about 50% brightness of the LED luminescent component; when the first number N is predetermined to be 200, the second number (M=1) corresponds to about 0.5% brightness of the LED luminescent component, and the second number (M=50) corresponds to about 25% brightness of the LED luminescent component; when the first number N is predetermined to be 1000, the second number (M=1) corresponds to about 0.1% brightness of the LED luminescent component, and the second number (M=50) corresponds to about 5% brightness of the LED luminescent component. Therefore, the dimming accuracy of the LED luminaire is determined by the first number N, which is equal to (1/N)×100%. Correspondingly, the dimming depth of the LED luminaire, which means the brightness of the LED light luminescent component, is determined by the second number M output by the signal processing unit 12, which is equal to (M/N)×100%.

Figure 5:
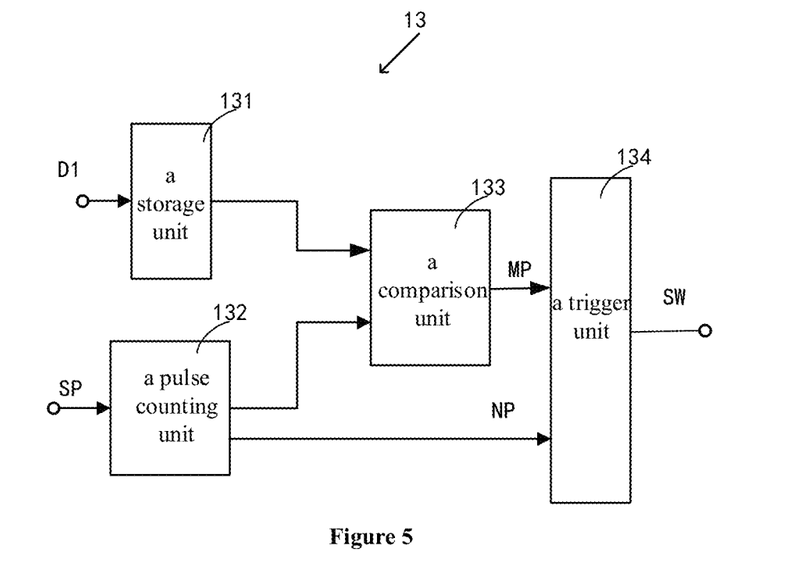
FIG. 5 schematically illustrates a structural diagram of a counting unit according to an embodiment.

FIG. 5 schematically illustrates a structural diagram of a counting unit 13 according to an embodiment. Referring to FIG. 5, in an embodiment, the counting unit 13 includes a storage unit 131, a pulse counting unit 132 and a comparison unit 133. Specifically, the storage unit 131 is adapted to store the first number N and the second number M received from the signal processing unit 12; the pulse counting unit 132 is adapted to count a number of rising or falling edges of pulses or square waves of the zero-crossing detection signal SP output by the zero-crossing detection unit 11 and generate a counting result, and when the counting result is equal to the first number N, the pulse counting unit 132 is adapted to output a set instruction; and the comparison unit 133 is adapted to compare the counting result with the second number M, and when the counting result is equal to the second number M, the comparison unit is adapted to output a reset instruction.

In some embodiments, the counting unit 13 further includes a trigger unit 134, where one input end of the trigger unit 134 is coupled to an output end of the comparison unit 133, another input end of the trigger unit 134 is coupled to an output end of the pulse counting unit 132, and an output end of the trigger unit 134 is coupled to a switch unit of the power adjusting circuit, which is adapted to output a switch control signal SW to control the switch unit to switch on or off.

The counting unit 13 counts the number of rising or falling edges of pulses or square waves of the zero-crossing detection signal SP, so as to count the number of sine waves or half-sine waves of the high-frequency signal during each period (for example, a dimming period which corresponds to a duration of N pulses) and to generate the counting result. Once the counting result reaches the first number N or the second number M, the switch unit is controlled to turn off or turn on the power supply of the LED luminescent component. In other words, by controlling the number of sine waves or half-sine waves of the high-frequency signal applied to the LED luminescent component within each period, the brightness of the LED luminescent component can be adjusted. Specifically, the storage unit 131 is adapted to temporarily store the first number N and the second number M received from the signal processing unit 12, and the pulse counting unit 132 is adapted to count the number of rising or falling edges of pulses or square waves of the zero-crossing detection signal SP output by the zero-crossing detecting unit 11 and to generate the counting result. The comparison unit 133 compares the counting result output by the pulse counting unit 132 with the second number M output by the storage unit 131. Once the counting result reaches the second number M, the comparison unit 133 outputs a reset instruction MP, and the trigger unit 134 uses the reset instruction MP to generate a switch control signal SW to control the switch unit to turn on or off. When the counting result reaches the first number N, the pulse counting unit 132 outputs a set instruction NP and resets the pulse counting unit 132 and the storage unit 131, so as to make preparations for a next dimming cycle. The trigger unit 134 uses the reset instruction MP to generate the switch control signal SW to control the switch unit to turn on or off.

In some embodiments, one input end of the switch unit 14 inputs the high-frequency signal SIN1, another input end of the switch unit 14 inputs the switch control signal SW which controls the switch unit 14 to turn on or off, and an output ends of the switch unit 14 outputs a periodic sinusoidal counting signal SOUT. In some embodiments, the switch unit 14 includes a power switch transistor. In some embodiments, the power switch transistor includes a Metal-Oxide-Semiconductor (MOS) transistor, or Bipolar Transistor, or an Insulated Gate Bipolar Transistor (IGBT), or a thyristor.

Figure 6:
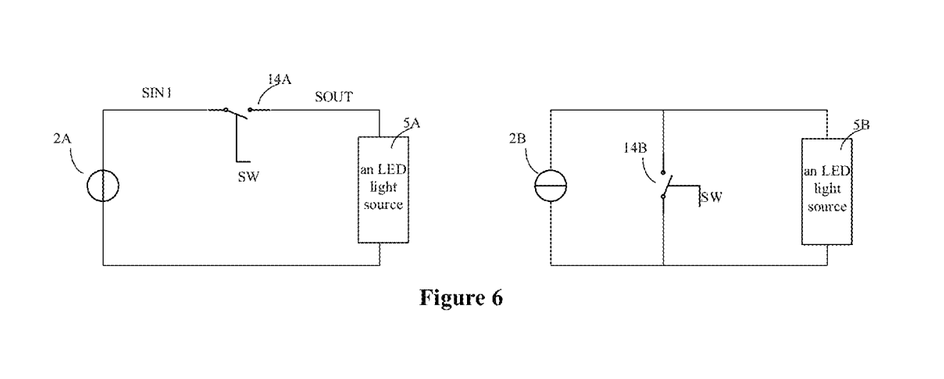
FIG. 6 schematically illustrates a structural diagram of a switch unit according to an embodiment.

The switch unit and the functional device may be connected in various ways. FIG. 6 schematically illustrates a structural diagram of a switch unit in an LED luminaire according to an embodiment. Referring to FIG. 6(*a*), a switch unit 14A is connected in series with a power supply 2A and an LED luminescent component 5A, and is controlled by the switch control signal SW output by the counting unit 13 to be turned on or off alternately. Referring to FIG. 6(*b*), a switch unit 14B is connected in parallel with a power supply 2B and an LED luminescent component 5B, and is controlled by the switch control signal SW output by the counting unit 13 to be turned on or off alternately.

In an embodiment, referring to FIG. 6(*a*), the switch unit 14A is connected in series with the power supply 2A and the LED luminescent component 5A. When the switch unit 14A is turned on, the power supply 2A provides constant power to the LED luminescent component 5A; and when the switch unit 14A is turned off, the circuit is disconnected, and the power supply 2A no longer provides power to the LED luminescent component 5A. The switch unit 14A is turned on or off alternately at a high frequency under the control of the switch control signal SW. Specifically, the reset instruction output by the counting unit is used to turn off the switch unit 14A, and the set instruction output by the counting unit is used to turn on the switch unit 14A.

In an embodiment, referring to FIG. 6(*b*), the switch unit 14B is connected in parallel with the power supply 2B and the LED luminescent component 5B. When the switch unit 14B is turned off, the power supply 2B provides constant power to the LED luminescent component 5B; and when the switch unit 14B is turn on, the power supply 2B is bypassed and no longer provides power to the LED luminescent component 5B. The switch unit 14B is turned on or off alternately at a high frequency under the control of the switch control signal SW. Specifically, the reset instruction output by the counting unit is used to turn on the switch unit 14B, and the set instruction output by the counting unit is used to turn off the switch unit 14B.

Figure 7:
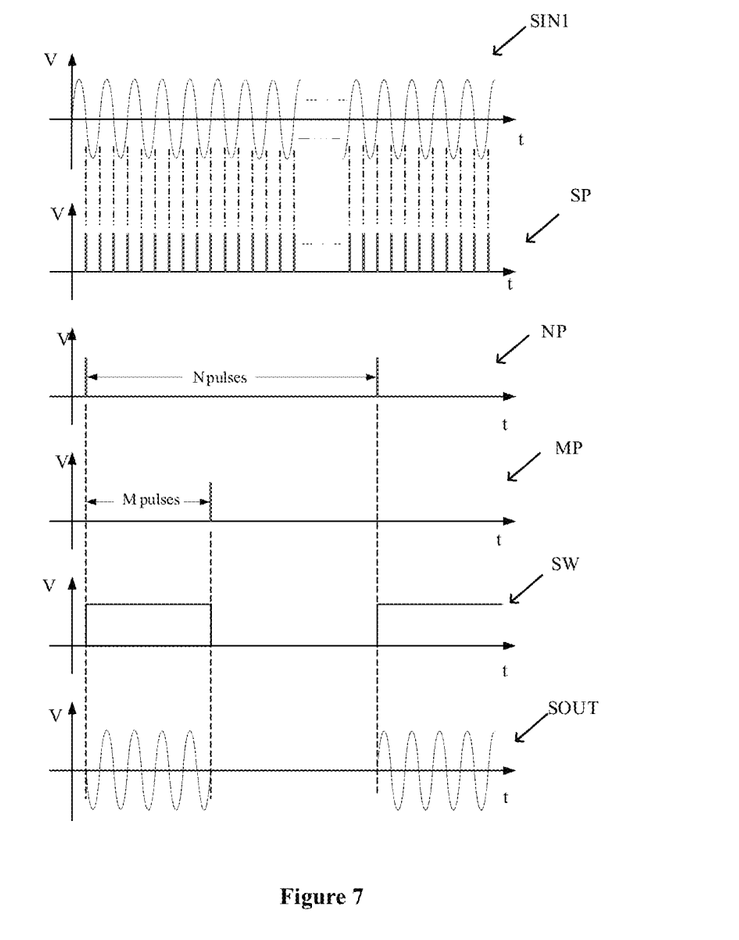
FIG. 7 schematically illustrates voltage waveforms of an LED luminaire in work according to an embodiment.

FIG. 7 schematically illustrates voltage waveforms of an LED luminaire in operation provided in embodiments of the present disclosure in conjunction with FIG. 2 according to an embodiment, where an abscissa represents time and an ordinate represents voltage (that is, signal amplitude). FIG. 7 illustrates the voltage waveforms of the high-frequency signal SIN, the zero-crossing detection signal SP (a pulse wave is taken as an example), the switch control signal SW, the reset instruction MP, the set instruction NP, and the periodic sinusoidal counting signal SOUT. Referring to FIGS. 1 to 7, the external power line frequency signal SE is coupled to the input end of the frequency conversion circuit 2, and the frequency conversion circuit 2 converts the external power line frequency signal SE to the high-frequency signal SIN and outputs the high-frequency signal SIN. The high-frequency signal SIN may be a sine wave or an AC wave. In the embodiments, that the high-frequency signal SIN is a sine wave is taken as an example for illustration. Those skilled in the art can understand that, when the high-frequency signal SIN is an AC wave, working principles are similar to that of a sine wave, and will not be repeated in detail here. The zero-crossing detecting unit 11 of the power adjusting circuit 3 performs zero-crossing detection on the high-frequency signal SIN and outputs a zero-crossing detection signal SP. The zero-crossing detection signal SP is synchronized with the high-frequency signal SIN, and the number of pulses of the zero-crossing detection signal SP is same as the number of sine waves or half-sine waves of the high-frequency signal SIN. In addition, the moments when the pulses of the zero-crossing detection signal SP are generated are same as the moments when the high-frequency signal SIN transforms through zero points. The counting unit 13 in the power adjusting circuit 3 receives the first number N and the second number M output from the signal processing unit 12, counts the number of pulses of the zero-crossing detection signal SP and generates the counting result. When the counting result reaches the first number N, the set instruction is output; and when the counting result reaches the second number M, the reset instruction is output. The set instruction and the reset instruction are used to control the switch unit 14 in the power adjusting circuit 3 to be turned on or off, so as to control the power of the high-frequency signal SIN1 provided to the LED luminescent component in the subsequent circuit, thereby adjusting the brightness of the LED luminescent component.

In an embodiment of the present disclosure, an LED power supply is provided. The LED power supply includes: a frequency conversion circuit, adapted to convert an external power line frequency signal into a high-frequency signal; and a power adjusting circuit, adapted to modulate the high frequency signal output by the frequency conversion circuit into a periodic sinusoidal counting signal according to a dimming signal input externally.

In summary, according to the embodiments of the present disclosure, the power adjusting circuit uses half-waves of an AC sine or quasi-sine wave as an energy base unit, and by controlling the number of energy base units provided to a subsequent functional device per period, the power of the functional device can be adjusted.

The LED power supply and the LED luminaire provided in the embodiments of the present disclosure detect and count the number of the AC sine or quasi-sine wave transforming from a positive half cycle to a negative half cycle or from a negative half cycle to a positive half cycle, thereby controlling the number of sine or quasi-sine half-waves provided to the LED luminescent component per period. In this way, the power provided to the LED luminescent component is controlled, thereby controlling the brightness of the LED luminescent component.

Furthermore, in the power adjusting circuit, the LED power supply and the LED luminaire provided in the embodiments of the present disclosure, the switch unit performs chopper control on the AC sine or quasi-sine wave rather than a DC voltage/current, and switching operations only occur when the AC sine or quasi-sine signal transforms through zero-crossing points, which greatly reduces electromagnetic interference in the LED power supply and the LED luminaire.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A power adjusting circuit, comprising:
   a zero-crossing detecting unit, adapted to generate a zero-crossing detection signal according to an high-frequency signal input externally, wherein the zero-crossing detection signal is a pulse wave or a square wave, and the high-frequency signal is a sine wave or an alternating current (AC) wave;
   a signal processing unit, adapted to determine a second number of pulses or square waves of the zero-crossing detection signal corresponding to an external input adjustment signal, according to a first number of pulses or square waves of the zero-crossing detection signal corresponding to a full-load operation of a functional device, wherein the first number is predetermined;
   a counting unit, adapted to generate a switch control signal according to the first number and the second number; and
   a switch unit, adapted to control an output of the high-frequency signal according to the switch control signal.

2. The power adjusting circuit according to claim 1, wherein the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

3. The power adjusting circuit according to claim 1, wherein the signal processing unit comprises:
   an input interface, adapted to receive the adjustment signal, wherein the adjustment signal comprises a dimming signal;
   a dimming signal processor, adapted to determine the second number of the zero-crossing detection signal corresponding to the dimming signal, according to the first number of the zero-crossing detection signal corresponding to the full-load operation of the functional device; and
   an output interface, adapted to output the first number and the second number.

4. The power adjusting circuit according to claim 3, wherein the first number is changeable.

5. The power adjusting circuit according to claim 1, wherein the counting unit comprises:
   a storage unit, adapted to store the first number and the second number received from the signal processing unit;
   a pulse counting unit, adapted to count a number of rising or falling edges of pulses or square waves of the zero-crossing detection signal output by the zero-crossing detecting unit and generate a counting result, and when the counting result is equal to the first number, the pulse counting unit is adapted to output a set instruction; and a comparison unit, adapted to compare the counting result with the second number, and when the counting result is equal to the second number, the comparison unit is adapted to output a reset instruction.

6. The power adjusting circuit according to claim 5, wherein the counting unit further comprises a trigger unit, where one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

7. The power adjusting circuit according to claim 1, wherein the switch unit comprises a power switch transistor.

8. The power adjusting circuit according to claim 7, wherein the power switch transistor comprises a Metal-Oxide-Semiconductor (MOS) transistor, or Bipolar Transistor (BJT), or an Insulated Gate Bipolar Transistor (IGBT), or a thyristor.

9. A light emitting diode (LED) power supply, comprising:
 a frequency conversion circuit, adapted to convert an external power line frequency signal into a high-frequency signal;
 a power adjusting circuit, adapted to modulate the high frequency signal output by the frequency conversion circuit into a periodic sinusoidal counting signal according to a dimming signal input externally; and
 a rectifier filter circuit, adapted to, according to the periodic sinusoidal counting signal, generate a driving direct current which is used as a working current of an LED luminescent component;
 wherein the power adjusting circuit comprises:
 a zero-crossing detecting unit, adapted to generate a zero-crossing detection signal according to the high-frequency signal, wherein the zero-crossing detection signal is a pulse wave or a square wave, and the high-frequency signal is a sine wave or an alternating current (AC) wave;
 a signal processing unit, adapted to determine a second number of pulses or square waves of the zero-crossing detection signal corresponding to the dimming signal, according to a first number of pulses or square waves of the zero-crossing detection signal corresponding to a full-load operation of the LED luminescent component, wherein the first number is predetermined;
 a counting unit, adapted to generate a switch control signal according to the first number and the second number; and
 a switch unit, adapted to control an output of the high-frequency signal according to the switch control signal.

10. The LED power supply according to claim 9, wherein the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

11. The LED power supply according to claim 9, wherein the signal processing unit comprises:
 an input interface, adapted to receive the dimming signal;
 a dimming signal processor, adapted to determine the second number of the zero-crossing detection signal corresponding to the dimming signal, according to the first number of the zero-crossing detection signal corresponding to the full-load operation of the LED luminescent component; and
 an output interface, adapted to output the first number and the second number.

12. The LED power supply according to claim 9, wherein the first number is changeable.

13. The LED power supply according to claim 9, wherein the counting unit comprises:
 a storage unit, adapted to store the first number and the second number received from the signal processing unit;
 a pulse counting unit, adapted to count a number of rising or falling edges of pulses or square waves of the zero-crossing detection signal outputted by the zero-crossing detecting unit and generate a counting result, and when the counting result is equal to the first number, the pulse counting unit is adapted to output an set instruction;
 a comparison unit, adapted to compare the counting result with the second number, and when the counting result is equal to the second number, the comparison unit is adapted to output a reset instruction; and
 a trigger unit, where one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

14. A light emitting diode (LED) luminaire, comprising an LED luminescent component, further comprising:
 a frequency conversion circuit, adapted to convert an external power line frequency signal into a high-frequency signal;
 a power adjusting circuit, adapted to modulate the high frequency signal output by the frequency conversion circuit into a periodic sinusoidal counting signal according to a dimming signal input externally; and
 a rectifier filter circuit, adapted to, according to the periodic sinusoidal counting signal, generate a driving direct current for the LED luminescent component;
 wherein the power adjusting circuit comprises:
 a zero-crossing detecting unit, adapted to generate a zero-crossing detection signal according to the high-frequency signal, wherein the zero-crossing detection signal is a pulse wave or a square wave, and the high-frequency signal is a sine wave or an alternating current (AC) wave;
 a signal processing unit, adapted to determine a second number of pulses or square waves of the zero-crossing detection signal corresponding to the dimming signal, according to a first number of pulses or square waves of the zero-crossing detection signal corresponding to a full-load operation of the LED luminescent component, wherein the first number is predetermined;
 a counting unit, adapted to generate a switch control signal according to the first number and the second number; and
 a switch unit, adapted to control an output of the high-frequency signal according to the switch control signal.

15. The LED luminaire according to claim 14, wherein the zero-crossing detecting unit generates pulses or square waves of the zero-crossing detection signal by detecting zero-crossing points of the high-frequency signal while transforming from a positive half cycle to a negative half cycle or from a negative half cycle to a positive half cycle.

16. The LED luminaire according to claim 14, wherein the signal processing unit comprises:
   an input interface, adapted to receive the dimming signal;
   a dimming signal processor, adapted to determine the second number of the zero-crossing detection signal corresponding to the dimming signal, according to the first number of the zero-crossing detection signal corresponding to the full-load operation of the LED luminescent component; and
   an output interface, adapted to output the first number and the second number.

17. The LED luminaire according to claim 14, wherein the counting unit comprises:
   a storage unit, adapted to store the first number and the second number received from the signal processing unit;
   a pulse counting unit, adapted to count a number of rising or falling edges of pulses or square waves of the zero-crossing detection signal outputted by the zero-crossing detecting unit and generate a counting result, and when the counting result is equal to the first number, the pulse counting unit is adapted to output an set instruction;
   a comparison unit, adapted to compare the counting result with the second number, and when the counting result is equal to the second number, the comparison unit is adapted to output a reset instruction; and
   a trigger unit, wherein one input end of the trigger unit is coupled to an output end of the comparison unit, another input end of the trigger unit is coupled to an output end of the pulse counting unit, and an output end of the trigger unit is coupled to the switch unit, which is adapted to control the switch unit to switch on or off according to the set instruction or the reset instruction.

* * * * *